(12) United States Patent
Tanwar et al.

(10) Patent No.: US 8,586,473 B1
(45) Date of Patent: Nov. 19, 2013

(54) METHODS FOR FABRICATING INTEGRATED CIRCUITS WITH RUTHENIUM-LINED COPPER

(75) Inventors: Kunaljeet Tanwar, Slingerlands, NY (US); Xunyuan Zhang, Albany, NY (US); Ming He, Slingerlands, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/533,816

(22) Filed: Jun. 26, 2012

(51) Int. Cl.
*H01L 21/44* (2006.01)
(52) U.S. Cl.
USPC ............... 438/652; 438/653; 257/E21.584; 257/E23.021
(58) Field of Classification Search
USPC ............ 438/652, 653; 257/E21.584, E23.012
See application file for complete search history.

(56) References Cited

U.S. PATENT DOCUMENTS

| 6,979,625 | B1 | 12/2005 | Woo et al. |
| 2006/0113675 | A1 | 6/2006 | Chang et al. |
| 2011/0049716 | A1 | 3/2011 | Yang et al. |
| 2011/0074039 | A1 | 3/2011 | Zhang et al. |
| 2012/0001262 | A1 | 1/2012 | Kang et al. |
| 2013/0075908 | A1* | 3/2013 | Cabral et al. .................. 257/751 |

OTHER PUBLICATIONS

Translation of Official Communication prepared by the German Patent Office for German Patent Application No. 10 2013 200 048.0 dated Mar. 9, 2013.

* cited by examiner

*Primary Examiner* — David S Blum
(74) *Attorney, Agent, or Firm* — Ingrassia Fisher & Lorenz, P.C.

(57) ABSTRACT

Methods for fabricating integrated circuits are provided. In an embodiment, a method for fabricating an integrated circuit includes depositing a dielectric layer defining a plane. In the method, the dielectric layer is etched to form trenches. Then, a ruthenium-containing liner layer is deposited overlying the dielectric layer. The trenches are filled with copper-containing metal. The method includes recessing the copper-containing metal in each trench to form a space between the copper-containing metal and the plane. The space is filled with a capping layer. The layers are then planarized to at least the plane.

20 Claims, 3 Drawing Sheets

METHODS FOR FABRICATING INTEGRATED CIRCUITS WITH RUTHENIUM-LINED COPPER

TECHNICAL FIELD

The present disclosure generally relates to methods for fabricating integrated circuits, and more particularly relates to methods for fabricating integrated circuits with ruthenium-lined copper interconnect structures.

BACKGROUND

Conductive metal interconnect structures are formed to electrically connect source/drain regions and conductive features of an integrated circuit. The interconnect structures are conventionally formed by patterning and etching a dielectric material layer to form a trench therein, depositing a liner/barrier layer, typically a combination of layers, such as of titanium (Ti), tantalum (Ta), ruthenium (Ru), titanium nitride (TiN), tantalum nitride (TaN), tungsten nitride (WN), and/or cobalt (Co), to line the side surfaces and bottom of the trench, and depositing a conductive material, such as tungsten (W) or copper (Cu), to fill the trench. The liner/barrier layers are provided to prevent diffusion of conductive material into the dielectric material layer and to enhance adhesion of the conductive material to the walls of the trench.

However, the use of ruthenium liners with copper can lead to formation of a galvanic cell, leading to copper corrosion and active copper ions. The copper ions may migrate over the upper surfaces of the liners to the dielectric material, leading to time dependent dielectric breakdown (TDDB). Therefore, improved methods for fabricating integrated circuits with ruthenium-lined copper interconnect structures are desired. Specifically, such methods are desired to prevent formation of galvanic cells, copper corrosion, and copper ion migration into dielectric material.

Accordingly, it is desirable to provide methods for fabricating integrated circuits with ruthenium-lined copper interconnect structures. In addition, it is desirable to provide methods for fabricating integrated circuits which avoid copper corrosion and contamination of dielectric material with copper. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In accordance with one embodiment, a method for fabricating an integrated circuit includes depositing a dielectric layer defining a plane. In the method, the dielectric layer is etched to form trenches. Then, a ruthenium-containing liner layer is deposited overlying the dielectric layer. The trenches are filled with copper-containing metal. The method includes recessing the copper-containing metal in each trench to form a space between the copper-containing metal and the plane. The space is filled with a capping layer. The layers are then planarized to at least the plane.

In another embodiment, a method for fabricating an integrated circuit includes providing a partially fabricated integrated circuit including a dielectric layer formed with trenches having openings, a ruthenium-containing liner layer overlying the dielectric layer, and a copper-containing metal in the trenches. The method includes capping the copper-containing metal with a capping layer. Also, the method includes planarizing the partially fabricated integrated circuit to remove the ruthenium-containing liner layer between trenches, a portion of the dielectric layer between trenches and a portion of the capping layer.

In accordance with another embodiment, in a method for fabricating an integrated circuit, a metal interconnect structure including copper bounded by a ruthenium liner and positioned in a dielectric layer is formed. The copper is encapsulated by depositing a capping layer over the copper. Further, the method includes planarizing a portion of the capping layer, a portion of the dielectric material, and portions of the ruthenium liner not adjacent the metal interconnect structure.

BRIEF DESCRIPTION OF THE DRAWINGS

Embodiments of methods for fabricating integrated circuits with ruthenium-lined copper interconnect structures will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits with ruthenium-lined copper interconnect structures are provided. The methods described herein avoid or reduce problems with conventional processes when utilizing copper interconnect structures with ruthenium liners. Specifically, it has been found that conventional processing leads to the formation of a galvanic cell between the copper and the ruthenium. During any planarization step that simultaneously planarizes the copper, ruthenium and dielectric material, active copper ions can migrate to the dielectric material, resulting in copper corrosion and TDDB degradation.

To avoid this copper corrosion and TDDB degradation, the present methods prevent exposure of copper to dielectric material. Further, the present methods prevent any copper-ruthenium interaction during planarization of the ruthenium. Specifically, the present methods recess copper within ruthenium-lined trenches and cap or otherwise encapsulate the copper, such as with cobalt, manganese, cobalt-tungsten-phosphorus, tantalum, titanium, tantalum-titanium, or dielectric material. Then, the ruthenium may be planarized. During ruthenium planarization, a portion of the capping material is planarized. The copper remains encapsulated below the capping material and is not planarized with the ruthenium. As a result, copper ion migration, and the resulting TDDB, is inhibited. Processing before and after the method steps described herein may be varied depending on the desired integrated circuit structure and/or process flow.

FIGS. 1-7 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components.

Figure 1:
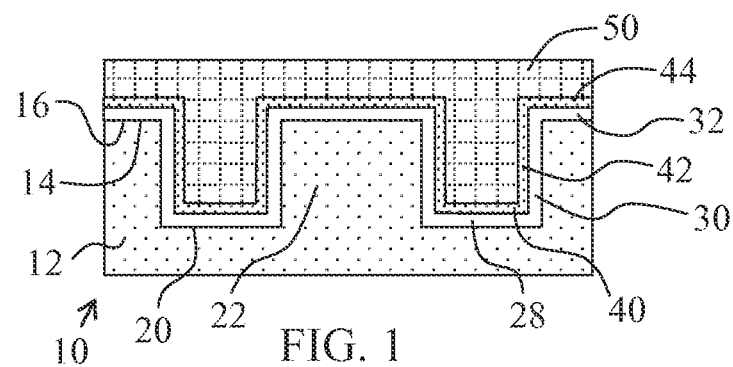
FIGS. 1-7 illustrate, in cross section, a portion of an integrated circuit and method steps for fabricating an integrated circuit in accordance with various embodiments herein.

In FIG. 1, in an exemplary embodiment, the process of fabricating an integrated circuit 10 begins by providing a dielectric material 12. In typical fabrication processes, the dielectric material 12 is deposited over transistor devices on a semiconductor substrate after front-end-of-line (FEOL) processing is completed. As shown, the dielectric material 12 has a surface 14 defining a plane 16. Conventionally, the dielectric material 12 is deposited by chemical vapor deposition (CVD) though any desired deposition process may be used. While the dielectric material 12 may be any appropriate material for insulating or isolating the transistors and back-end-of-line (BEOL) interconnect structures, in an exemplary embodiment it is an ultra low-k (ULK) dielectric material.

As shown, trenches 20 are etched or otherwise formed in the dielectric material 12, leaving non-etched portions 22 of the dielectric material 12. The etch process may include selective oxide masking steps following by a reactive ion etch (RIE), though any suitable etching process can be used. After the trenches 20 are formed, a diffusion barrier liner 28 is formed over the dielectric material 12. As shown, the diffusion barrier liner 28 includes trench portions 30, i.e., portions lining the trenches 20, and intertrench portions 32, i.e., portions overlying the non-etched portions 22 of the dielectric material 12.

The barrier liner 28 may be formed by any barrier material or materials that exhibit sufficient adhesion to the dielectric material 12, thermal stability, and ease of deposition. For example, barrier liner 28 may be tantalum-based or titanium-based. In an exemplary embodiment, the barrier liner is a tantalum/tantalum nitride (Ta/TaN) bilayer stack. The barrier liner layers may be deposited by atomic layer deposition (ALD), physical vapor deposition (PVD) such as radiofrequency (RF) sputter deposition, or CVD depending on the process flow and technology node. An exemplary barrier liner 28 has a thickness of about 20 Å to about 80 Å, depending on the technology and integration scheme.

After forming the diffusion barrier liner 28, a ruthenium-containing liner 40 is deposited over the partially-fabricated integrated circuit 10. As shown, the ruthenium-containing liner 40 includes trench portions 42, i.e., portions within the trenches 20 and intertrench portions 44, i.e., portions overlying the non-etched portions 22 of the dielectric material 12.

The ruthenium-containing liner 40 may be formed of substantially pure ruthenium, ruthenium alloy(s), or multi-layer liners including at least one layer of pure ruthenium or ruthenium alloy(s). Typically, the ruthenium-containing liner 40 has a thickness of about 10 Å to about 40 Å, and is deposited by CVD or PVD.

Figure 2:
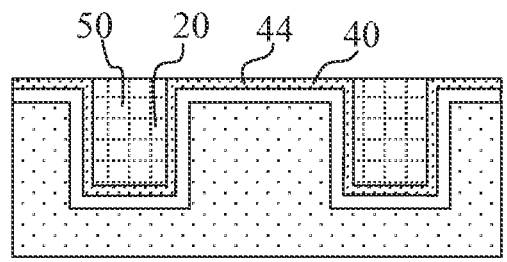

In FIG. 1, a copper-containing metal 50, such as substantially pure copper, is deposited over the partially-fabricated integrated circuit 10 and fills the trenches 20. The copper-containing metal 50 may be deposited by PVD. The copper-containing metal 50 is then planarized, such as by chemical mechanical planarization (CMP), to the intertrench portions 44 of the ruthenium-containing liner 40. As a result, the copper-containing metal 50 is present only in the trenches 20, as shown in FIG. 2.

Figure 3:
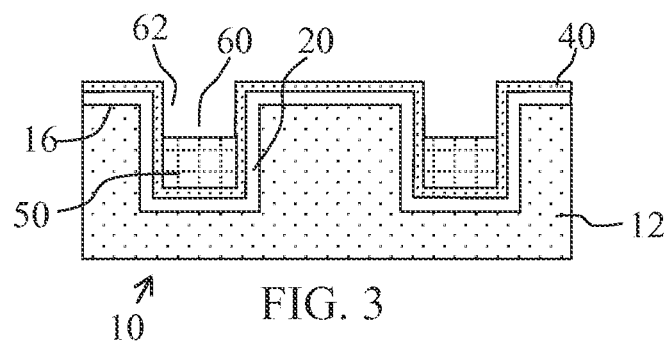

In FIG. 3, the copper-containing metal 50 in the trenches 20 is recessed to form spaces 60 between the copper-containing metal 50 and the plane 16, i.e., between the copper-containing metal 50 and the openings 62 to the trenches 20. The copper-containing metal 50 may be recessed by any appropriate chemistry that does not etch the ruthenium-containing liner 40. In an exemplary process, the copper-containing metal 50 is etched by SC1 chemistry (ammonium hydroxide, hydrogen peroxide, and de-ionized water) followed by citric acid. In another exemplary process, the copper-containing metal 50 is etched by SC1 chemistry followed by diluted hydrofluoric acid.

After formation of the partially-fabricated integrated circuit 10 of FIG. 3, the copper-containing metal 50 capped and encapsulated to be isolated from the dielectric material 12. This process can be performed via a selective deposition, shown in FIGS. 4 and 5, or by a non-selective deposition process, shown in FIGS. 6 and 7.

Figure 4:
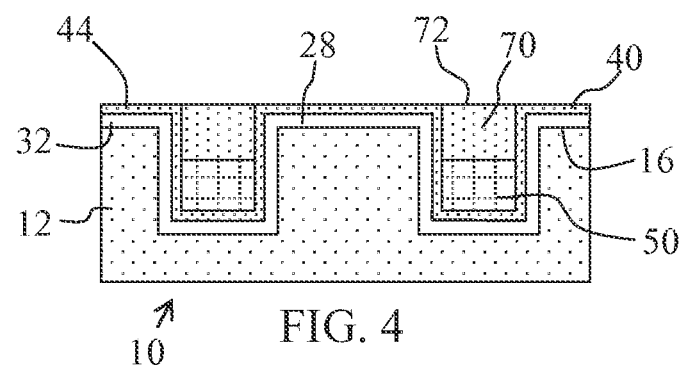

In FIG. 4, a capping material 70 is selectively deposited on the copper-containing metal 50. While the surface 72 of the capping material 70 is shown as being substantially even with the ruthenium-containing liner 40, the capping material 70 can be deposited to a lower level, such as to the level of the plane 16 formed by dielectric material 12. In an exemplary embodiment, the capping material 70 is a cobalt-containing metal, such as substantially pure cobalt (Co). In other exemplary embodiments, the capping material 70 is formed by cobalt-tungsten-phosphorus (CoWP) or by a manganese-containing metal, such as substantially pure manganese (Mn). The capping material 70 may be selectively deposited on the copper-containing metal 50 by a selective CVD process, if Co or Mn, or by a selective electroless process, if CoWP.

Figure 5:
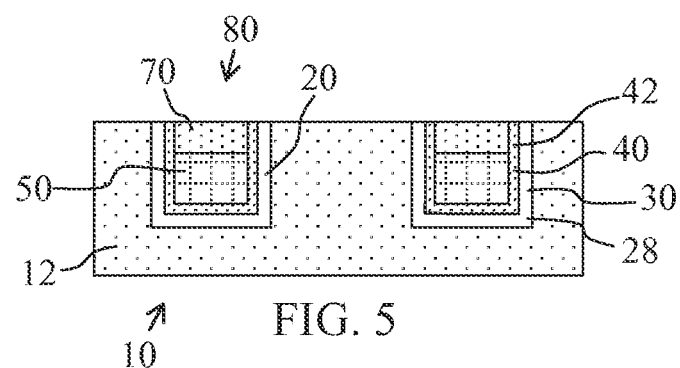

In FIG. 5, a planarization process, such as CMP, has removed the intertrench portions 32 of the barrier liner 28 and the intertrench portions 44 of the ruthenium-containing liner 40. The planarization process has also removed upper sections of the trench portions 30 of the barrier liner 28, upper sections of the trench portions 42 of the ruthenium-containing liner 40 as well as portions of the capping layer 70 and, as the planarization process extends past the plane 16 of the dielectric material 12, portions of the dielectric material 12.

As a result of the planarization process, a metal interconnect structure 80 is formed within the trenches 20 in the dielectric material 12 and includes the copper-containing metal 50 encapsulated by the capping layer 70 and the ruthenium-containing liner 40. Due to the metal interconnect structure 80, copper ion activity is inhibited and copper cannot diffuse to the dielectric material. Further, because no planarization process simultaneously removes copper and dielectric material, the dielectric material has not been exposed to copper during planarization. Copper-ruthenium galvanic activity is avoided because there is no aqueous environment to create an electrochemical cell after the copper is encapsulated by the capping layer, and because after encapsulation by the capping layer there is no free copper surface and no place for copper ions to go even if copper is oxidized to copper ions. As a result, the kinetics will be extremely slow or negligible.

Figure 6:
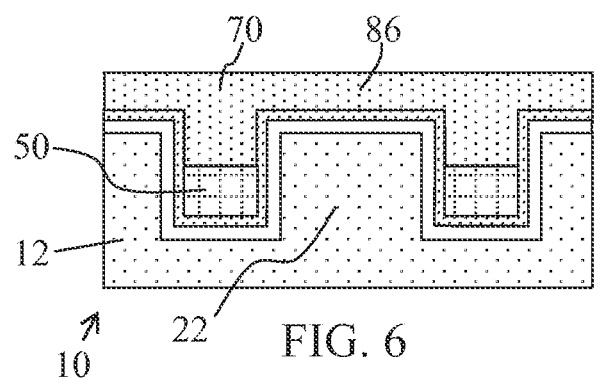

FIG. 6 illustrates an embodiment in which the capping layer 70 is non-selectively deposited over the partially-fabricated integrated circuit 10 of FIG. 3. The capping material 70 may be deposited on the copper-containing metal 50 by non-selective PVD. A non-selectively deposited capping layer 70 may be metal-based, such as tantalum, titanium or tantalum-titanium alloys. Alternatively, the non-selectively deposited capping layer 70 can be a dielectric material, such as Nblok (SiCNH).

Figure 7:
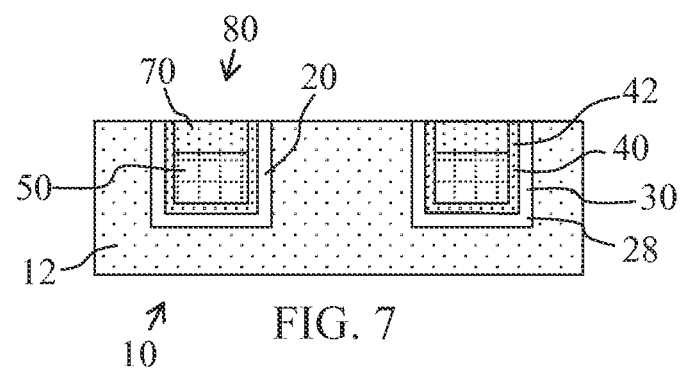

As a result of the non-selective deposition of the capping 70, intertrench portions 86 of the capping layer 70 are formed above the non-etched portions 22 of the dielectric material 12. Therefore, the planarization process removes the intertrench portions 86 of the capping layer 70 along with the intertrench portions 32 of the barrier liner 28, and the intertrench portions 44 of the ruthenium-containing liner 40. The planarization process also removes upper sections of the trench portions 30 of the barrier liner 28, upper sections of the trench portions 42 of the ruthenium-containing liner 40 as well as portions of the capping layer 70 in the trenches 20 and, as the planarization process extends past the plane 16 of the dielectric material 12, portions of the dielectric material 12. The resulting partially-fabricated integrated circuit 10 is shown in FIG. 7. As shown, the metal interconnect structure 80 of FIG. 7 is identical to that of FIG. 5. The metal interconnect structure 80 is formed within the trenches 20 in the dielectric material 12 and includes the copper-containing metal 50 encapsulated by the capping layer 70 and the ruthenium-containing liner 40. As a result of the metal interconnect structure 80, copper ion activity is inhibited and copper cannot diffuse to the dielectric material. Further, because no planarization process simultaneously removes copper and dielectric material, the dielectric material has not been exposed to copper during planarization.

As described above, fabrication processes are implemented to form integrated circuits with ruthenium-lined copper interconnect structures. Conventional metal interconnect fabrication processes lead to copper corrosion and TDDB when used with copper interconnect structures lined with ruthenium. These issues are avoided by recessing and capping the copper metal layers within dielectric trenches before planarization. Specifically, the copper is encapsulated and is not contacted when the dielectric material and ruthenium-containing liner are planarized. As a result, copper corrosion due to copper-ruthenium galvanic interaction is inhibited, and copper ions are prevented from migrating to the dielectric material. Further, the dielectric is not contaminated with copper during planarization.

To briefly summarize, the fabrication methods described herein result in integrated circuits with improved copper interconnect performance and improved TDDB resistance. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   depositing a dielectric layer having an upper surface defining a plane;
   etching the dielectric layer to form trenches defined by trench surfaces;
   depositing a ruthenium-containing liner layer overlying the dielectric layer;
   filling the trenches with copper-containing metal;
   recessing the copper-containing metal in each trench to form a space between the copper-containing metal and the plane while the ruthenium-containing liner layer covers the upper surface of the dielectric layer adjacent each trench;
   filling the space with a capping layer; and
   planarizing the layers to at least the plane.

2. The method of claim 1 further comprising depositing a barrier layer overlying the trench surfaces of the dielectric layer and directly on the upper surface of the dielectric layer before depositing the ruthenium-containing liner layer.

3. The method of claim 1 further comprising depositing a barrier layer overlying the trench surfaces of the dielectric layer and directly on the upper surface of the dielectric layer before depositing the ruthenium-containing liner layer, wherein the barrier layer comprises tantalum and tantalum nitride.

4. The method of claim 1 wherein filling the space with a capping layer comprises selectively depositing a capping layer selected from cobalt, manganese, and cobalt-tungsten-phosphorus onto the copper-containing metal.

5. The method of claim 4 wherein selectively depositing the capping layer on the copper-containing metal comprises selectively depositing cobalt or manganese onto the copper-containing metal by chemical vapor deposition.

6. The method of claim 4 wherein selectively depositing the capping layer on the copper-containing metal comprises depositing cobalt-tungsten-phosphorus onto the copper-containing metal by electroless deposition.

7. The method of claim 1 wherein filling the space with a capping layer comprises non-selectively depositing a capping layer selected from tantalum, titanium, tantalum-titanium, and dielectric material overlying the ruthenium-containing liner layer and the copper-containing metal.

8. The method of claim 1 wherein filling the trenches with copper-containing metal comprises depositing the copper-containing metal overlying the ruthenium-containing liner layer, and wherein the method further comprises planarizing the copper-containing metal to the ruthenium-containing liner layer before recessing the copper-containing metal in the trenches.

9. The method of claim 1 wherein depositing a ruthenium-containing liner layer overlying the dielectric layer comprises forming trench portions of the ruthenium-containing liner overlying the trench surfaces of the dielectric layer and a trench adjacent portions of the ruthenium-containing liner overlying the upper surface of the dielectric layer; and wherein filling the trenches with copper-containing metal comprises depositing the copper-containing metal overlying the trench portions and the trench adjacent portions of the ruthenium-containing liner.

10. A method for fabricating an integrated circuit comprising:
    providing a partially fabricated integrated circuit including a dielectric layer formed with trenches having openings, a ruthenium-containing liner layer overlying the dielectric layer, and a copper-containing metal in the trenches;
    capping the copper-containing metal with a capping layer; and
    planarizing the partially fabricated integrated circuit to remove the ruthenium-containing liner layer between trenches, a portion of the dielectric layer between trenches, and a portion of the capping layer.

11. The method of claim 10 wherein providing a partially fabricated integrated circuit comprises providing the dielectric layer with an upper surface between the openings, and wherein the method further comprises covering the upper surface of the dielectric layer between the openings with the ruthenium-containing liner while capping the copper-containing metal with a capping layer.

12. The method of claim 10 wherein capping the copper-containing metal with a capping layer comprises non-selectively depositing a capping layer selected from tantalum, titanium, tantalum-titanium, and dielectric material onto the copper-containing metal in the trenches and overlying the ruthenium-containing liner layer.

13. The method of claim 10 wherein capping the copper-containing metal with a capping layer comprises:

recessing the copper-containing metal to form a space between the copper-containing metal and the opening of each trench; and filling the space with the capping layer.

14. The method of claim 10 wherein providing a partially fabricated integrated circuit comprises providing a partially fabricated integrated circuit including a dielectric layer formed with trenches having openings and an upper surface between the openings, and a barrier layer between the dielectric layer and the ruthenium-containing liner layer, wherein the barrier layer is formed directly on the upper surface of the dielectric layer.

15. The method of claim 10 wherein providing a partially fabricated integrated circuit comprises providing a partially fabricated integrated circuit including a dielectric layer formed with trenches having openings and an upper surface between the openings, and a barrier layer comprised of tantalum and tantalum nitride between the dielectric layer and the ruthenium-containing liner layer, wherein the barrier layer is formed directly on the upper surface of the dielectric layer.

16. The method of claim 10 wherein providing a partially fabricated integrated circuit comprises depositing the capping metal overlying the ruthenium-containing liner layer and planarizing the capping metal to the ruthenium-containing liner layer.

17. The method of claim 16 wherein capping the copper-containing metal with a capping layer comprises:

etching the copper-containing metal with ammonium hydroxide, hydrogen peroxide, and deionized water followed by citric acid or diluted hydrofluoric acid to form a space between the copper-containing metal and the opening of each trench; and filling the space with the capping layer.

18. A method for fabricating an integrated circuit comprising:

forming a metal interconnect structure including copper bounded by a ruthenium liner and positioned in a dielectric layer;

encapsulating the copper by depositing a capping layer over the copper; and planarizing a portion of the capping layer, a portion of the dielectric material, and portions of the ruthenium liner outside the metal interconnect structure.

19. The method of claim 18 wherein the dielectric layer has an upper surface adjacent the metal interconnect structure, and wherein forming a metal interconnect structure comprises forming a barrier liner between the ruthenium liner and the dielectric layer, wherein a portion of the barrier liner is formed on the upper surface of the dielectric layer.

20. The method of claim 18 wherein the dielectric layer has an upper surface adjacent the metal interconnect structure, and further comprising covering the upper surface of the dielectric layer with the portions of the ruthenium-containing liner outside the metal interconnect structure while encapsulating the copper by depositing a capping layer over the copper.

* * * * *